(12) United States Patent
Machnicki et al.

(10) Patent No.: US 8,786,332 B1
(45) Date of Patent: Jul. 22, 2014

(54) RESET EXTENDER FOR DIVIDED CLOCK DOMAINS

(71) Applicant: Apple Inc., Cupertino, CA (US)

(72) Inventors: Erik P. Machnicki, San Jose, CA (US); David S. Warren, Campbell, CA (US); Shane J. Keil, San Jose, CA (US); Sukalpa Biswas, Fremont, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/744,004

(22) Filed: Jan. 17, 2013

(51) Int. Cl.
*H03L 7/00* (2006.01)
*G06F 1/24* (2006.01)

(52) U.S. Cl.
CPC .......................................... *G06F 1/24* (2013.01)
USPC ............................................ 327/142; 327/198

(58) Field of Classification Search
CPC .......... G06F 1/24; H03K 17/22; H03K 17/30; H03K 17/223
USPC .......................................... 327/142, 143, 198
See application file for complete search history.

(56) References Cited

U.S. PATENT DOCUMENTS

| 3,998,044 | A | * | 12/1976 | Yamauchi et al. | ............... | 368/80 |
| 5,461,332 | A | * | 10/1995 | Mirov et al. | ..................... | 327/41 |
| 6,473,476 | B1 | | 10/2002 | Banks | | |
| 6,748,039 | B1 | | 6/2004 | Bates | | |
| 7,193,907 | B2 | * | 3/2007 | Nakatake et al. | ........ | 365/189.09 |
| 7,253,667 | B2 | | 8/2007 | Chen | | |
| 8,299,823 | B2 | * | 10/2012 | Banerjee et al. | ............. | 327/117 |
| 2010/0001762 | A1 | | 1/2010 | Kim | | |
| 2010/0005332 | A1 | | 1/2010 | Simon | | |
| 2010/0090730 | A1 | * | 4/2010 | Wu | ............................... | 327/143 |
| 2011/0025383 | A1 | * | 2/2011 | De Martini et al. | ........... | 327/143 |
| 2012/0144224 | A1 | | 6/2012 | Machnicki | | |
| 2012/0185703 | A1 | | 7/2012 | Machnicki | | |
| 2013/0332758 | A1 | * | 12/2013 | Sasaki | .......................... | 713/322 |

OTHER PUBLICATIONS

Frequency Dividers, www.play-hookey.com/digitalcounters/frequency_dividers.html, 1996, 2000-2012, 3 pages. [Retrieved Oct. 31, 2012].

* cited by examiner

*Primary Examiner* — William Hernandez
(74) *Attorney, Agent, or Firm* — Meyertons, Hood, Kivlin, Kowert & Goetzel, P.C.

(57) ABSTRACT

A clock divider may provide a lower speed clock to a logic block portion, but during reset, the clock divider may not operate properly, causing the logic block portion to be reset at a clock frequency greater than the frequency for which that logic was designed. However, an extended reset may be employed in which the clock divider is reset normally first before the logic block portion, allowing that logic to be reset according to the divided clock (e.g., rather than a higher speed clock). An asynchronous reset may also be employed in which one or more clock dividers first emerge from reset before being provided with a (synchronized) high speed clock signal, causing the clock dividers to be in phase with each other. This may enable communication between different areas of an IC that might not otherwise be in proper phase with each other.

20 Claims, 5 Drawing Sheets

RESET EXTENDER FOR DIVIDED CLOCK DOMAINS

BACKGROUND

This disclosure relates to circuit reset, and more particularly, relates to structures and techniques allowing for the proper reset of a circuit (or portions thereof) that operate according to a divided clock signal.

In an integrated circuit (IC), different portions may operate at different clock frequencies. For example, a clock divider may be used to "divide down" a given clock signal, and while one part of an IC may operate according to a higher rate clock, one or more other parts of the IC may operate at a lower frequency.

Ensuring that a clock signal reaches different portions of an IC at the same time (ensuring synchronicity) may be a complex task. If lower speed divided clock signals are used for part of an IC, there may be a further increase in design, test, and manufacturing costs to ensure that a divided clock signal (e.g., emanating from a single source) would arrive at different IC locations at roughly the same time. Further, during reset, a clock divider may stop functioning. This could cause lower speed portions of an IC to receive a non-divided (high speed) clock signal, or no clock signal at all.

SUMMARY

This specification describes structures and techniques that allow circuitry to be reset while being provided a divided clock signal, as well as synchronously resetting one or more clock dividers that receive a clock signal from a same clock source (and that are configured to generate a divided clock signal in response).

A logic block (e.g., a portion of an IC) may have a clock divider that provides a lower speed clock to (at least) part of the logic block. However, during reset, the clock divider may not operate properly, causing part of the logic block to be reset at a clock frequency greater than the frequency for which that logic is designed. In an extended reset mode, part of the logic block that includes the clock divider may be reset normally, after which a divided clock signal is resumed. The part of the logic block that is configured to operate at the lower, divided clock signal is then reset while being provided with the divided clock (rather than, e.g., a higher speed clock).

Further, an IC may have one clock that drives any number of clock dividers configured to provide one or more lower speed clocks. In some cases, these clock dividers may be located in geographically distant areas of the IC, but must be in phase with each other so that different parts of the IC operating on a divided clock frequency can communicate. (For example, two divided clocks may need to begin on a same cycle of a higher speed clock in order for communication to occur in some embodiments). An asynchronous reset may be employed in which various clock dividers must first emerge from reset before being provided with a (synchronized) high speed clock signal, causing the clock dividers to be in phase with each other.

Note that the teachings of this disclosure and the appended claims, however, are expressly not limited by the features, embodiments, and/or benefits discussed in the summary above.

DETAILED DESCRIPTION

Figure 1:
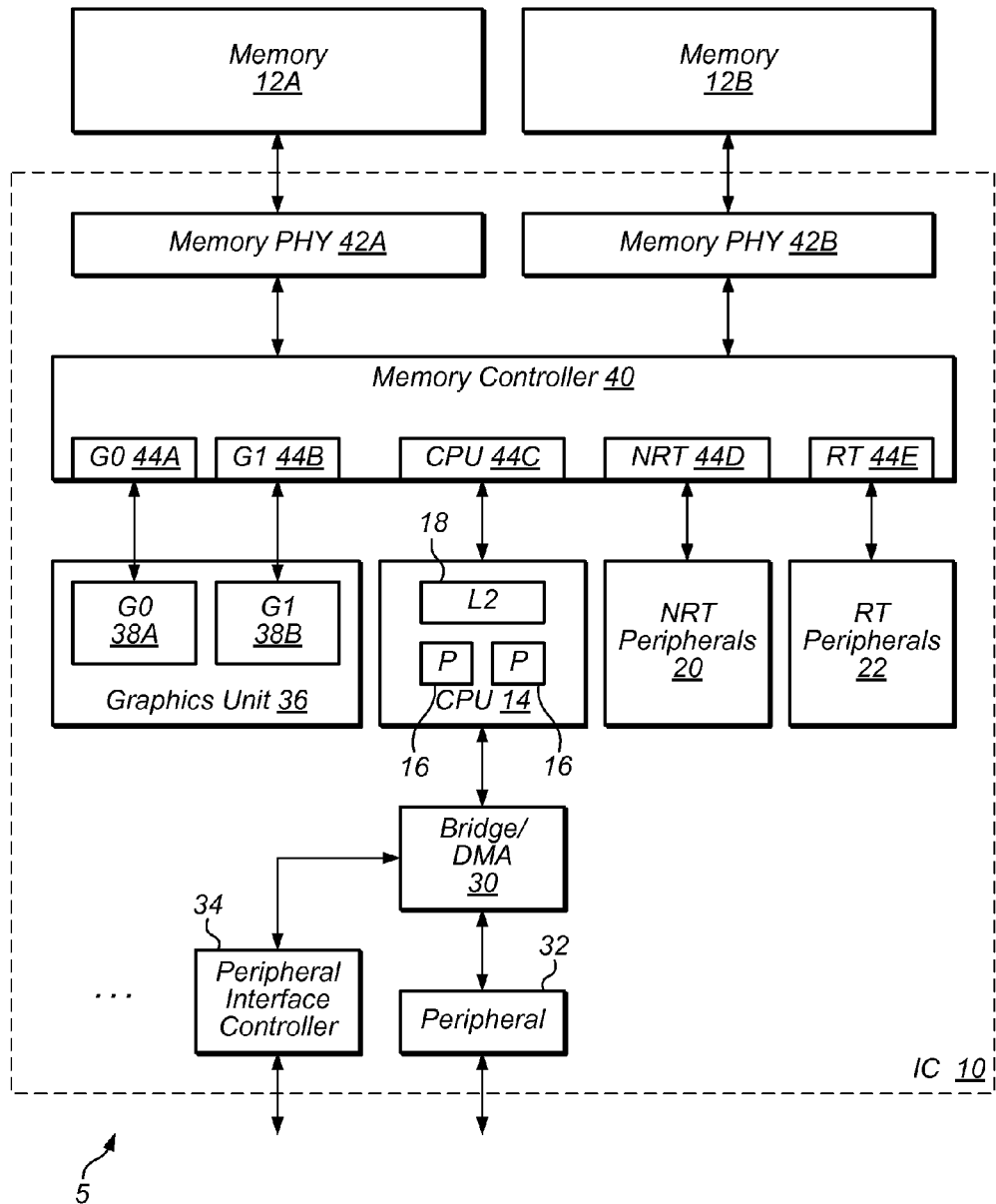
FIG. 1 is a block diagram of one embodiment of a system including an integrated circuit.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

The following paragraphs provide definitions and/or context for terms found in this disclosure (including the appended claims):

"Comprising." This term is open-ended. As used herein, this term does not foreclose additional structure or steps. Consider a claim that recites: "An apparatus comprising a logic block . . . ." Such a claim does not preclude the apparatus from including additional components (e.g., a central processing unit, a memory controller, interface circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., at a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (such as spatial, temporal, logical, etc.) unless otherwise expressly noted. For example, a "first" logic block and a "second" logic block can be used to refer to any two logic block, and does not necessarily imply that one logic block appears in some particular location relative to the second logic block (for example). In other words, "first" and "second" are descriptors.

"Based On." As used herein, this term is used to describe one or more factors that affect a determination. This term does not preclude additional factors from affecting a determination. That is, a determination may be based solely on those factors or based, at least in part, on those factors. Consider the phrase "determine A based on B." While B may be a factor that affects the determination of A, such a phrase does not foreclose the determination of A from also being based on C. In other instances, however, A may be determined based solely on B.

Integrated Circuit

Turning now to FIG. 1, a block diagram of one embodiment of a system 5 is shown. In various embodiments, system 5 may be used to implement reset-related techniques as described herein relative to other figures. In the embodiment of FIG. 1, the system 5 includes an integrated circuit (IC) 10 coupled to external memories 12A-12B. In the illustrated embodiment, the integrated circuit 10 includes a central processor unit (CPU) block 14 which includes one or more processors 16 and a level 2 (L2) cache 18. Other embodiments may not include L2 cache 18 and/or may include additional levels of cache. Additionally, embodiments that include more than two processors 16 and that include only one processor 16 are contemplated. The integrated circuit 10 further includes a set of one or more non-real time (NRT) peripherals 20 and a set of one or more real time (RT) peripherals 22. In the illustrated embodiment, the CPU block 14 is coupled to a bridge/direct memory access (DMA) controller 30, which may be coupled to one or more peripheral devices 32 and/or one or more peripheral interface controllers 34. The number of peripheral devices 32 and peripheral interface controllers 34 may vary from zero to any desired number in various embodiments. The system 5 illustrated in FIG. 1 further includes a graphics unit 36 comprising one or more graphics controllers such as G0 38A and G1 38B. The number of graphics controllers per graphics unit and the number of graphics units may vary in other embodiments. As illustrated in FIG. 1, the system 5 includes a memory controller 40 coupled to one or more memory physical interface circuits (PHYs) 42A-42B. The memory PHYs 42A-42B are configured to communicate on pins of the integrated circuit 10 to the memories 12A-12B. The memory controller 40 also includes a set of ports 44A-44E. The ports 44A-44B are coupled to the graphics controllers 38A-38B, respectively. The CPU block 14 is coupled to the port 44C. The NRT peripherals 20 and the RT peripherals 22 are coupled to the ports 44D-44E, respectively. The number of ports included in a memory controller 40 may be varied in other embodiments, as may the number of memory controllers. That is, there may be more or fewer ports than those shown in FIG. 1. The number of memory PHYs 42A-42B and corresponding memories 12A-12B may be one or more than two in other embodiments.

Generally, a port may be a communication point on the memory controller 40 to communicate with one or more sources. In some cases, the port may be dedicated to a source (e.g. the ports 44A-44B may be dedicated to the graphics controllers 38A-38B, respectively). In other cases, the port may be shared among multiple sources (e.g. the processors 16 may share the CPU port 44C, the NRT peripherals 20 may share the NRT port 44D, and the RT peripherals 22 may share the RT port 44E. Each port 44A-44E is coupled to an interface to communicate with its respective agent. The interface may be any type of communication medium (e.g. a bus, a point-to-point interconnect, etc.) and may implement any protocol. The interconnect between the memory controller and sources may also include any other desired interconnect such as meshes, network on a chip fabrics, shared buses, point-to-point interconnects, etc.

The processors 16 may implement any instruction set architecture, and may be configured to execute instructions defined in that instruction set architecture. The processors 16 may employ any microarchitecture, including scalar, superscalar, pipelined, superpipelined, out of order, in order, speculative, non-speculative, etc., or combinations thereof. The processors 16 may include circuitry, and optionally may implement microcoding techniques. The processors 16 may include one or more level 1 caches, and thus the cache 18 is an L2 cache. Other embodiments may include multiple levels of caches in the processors 16, and the cache 18 may be the next level down in the hierarchy. The cache 18 may employ any size and any configuration (set associative, direct mapped, etc.).

The graphics controllers 38A-38B may be any graphics processing circuitry. Generally, the graphics controllers 38A-38B may be configured to render objects to be displayed into a frame buffer. The graphics controllers 38A-38B may include graphics processors that may execute graphics software to perform a part or all of the graphics operation, and/or hardware acceleration of certain graphics operations. The amount of hardware acceleration and software implementation may vary from embodiment to embodiment. In some embodiments, graphics unit 36 and/or graphics controllers 38A-38B may include any or all of the features of graphics processing unit 50, as described below.

The NRT peripherals 20 may include any non-real time peripherals that, for performance and/or bandwidth reasons, are provided independent access to the memory 12A-12B. That is, access by the NRT peripherals 20 is independent of the CPU block 14, and may proceed in parallel with CPU block memory operations. Other peripherals such as the peripheral 32 and/or peripherals coupled to a peripheral interface controlled by the peripheral interface controller 34 may also be non-real time peripherals, but may not require independent access to memory. Various embodiments of the NRT peripherals 20 may include video encoders and decoders, scaler circuitry and image compression and/or decompression circuitry, etc.

The RT peripherals 22 may include any peripherals that have real time requirements for memory latency. For example, the RT peripherals may include an image processor and one or more display pipes. The display pipes may include circuitry to fetch one or more frames and to blend the frames to create a display image. The display pipes may further include one or more video pipelines. The result of the display pipes may be a stream of pixels to be displayed on the display screen. The pixel values may be transmitted to a display controller for display on the display screen. The image processor may receive camera data and process the data to an image to be stored in memory.

The bridge/DMA controller 30 may comprise circuitry to bridge the peripheral(s) 32 and the peripheral interface controller(s) 34 to the memory space. In the illustrated embodiment, the bridge/DMA controller 30 may bridge the memory operations from the peripherals/peripheral interface controllers through the CPU block 14 to the memory controller 40. The CPU block 14 may also maintain coherence between the bridged memory operations and memory operations from the processors 16/L2 Cache 18. The L2 cache 18 may also arbitrate the bridged memory operations with memory operations from the processors 16 to be transmitted on the CPU interface to the CPU port 44C. The bridge/DMA controller 30 may also provide DMA operation on behalf of the peripherals 32 and the peripheral interface controllers 34 to transfer blocks of data to and from memory. More particularly, the DMA controller may be configured to perform transfers to and from the memory 12A-12B through the memory controller 40 on behalf of the peripherals 32 and the peripheral interface controllers 34. The DMA controller may be programmable by the processors 16 to perform the DMA operations. For example, the DMA controller may be programmable via descriptors. The descriptors may be data structures stored in the memory 12A-12B that describe DMA transfers (e.g. source and destination addresses, size, etc.). Alternatively, the DMA controller may be programmable via registers in the DMA controller (not shown).

The peripherals 32 may include any desired input/output devices or other hardware devices that are included on the integrated circuit 10. For example, the peripherals 32 may include networking peripherals such as one or more networking media access controllers (MAC) such as an Ethernet MAC or a wireless fidelity (WiFi) controller. An audio unit including various audio processing devices may be included in the peripherals 32. One or more digital signal processors may be included in the peripherals 32. The peripherals 32 may include any other desired functional such as timers, an on-chip secrets memory, an encryption engine, etc., or any combination thereof.

The peripheral interface controllers 34 may include any controllers for any type of peripheral interface. For example, the peripheral interface controllers may include various interface controllers such as a universal serial bus (USB) controller, a peripheral component interconnect express (PCIe) controller, a flash memory interface, general purpose input/output (I/O) pins, etc.

The memories 12A-12B may be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with the integrated circuit 10 in a chip-on-chip configuration, a package-on-package configuration, or a multi-chip module configuration.

The memory PHYs 42A-42B may handle the low-level physical interface to the memory 12A-12B. For example, the memory PHYs 42A-42B may be responsible for the timing of the signals, for proper clocking to synchronous DRAM memory, etc. In one embodiment, the memory PHYs 42A-42B may be configured to lock to a clock supplied within the integrated circuit 10 and may be configured to generate a clock used by the memory 12.

It is noted that other embodiments may include other combinations of components, including subsets or supersets of the components shown in FIG. 1 and/or other components. While one instance of a given component may be shown in FIG. 1, other embodiments may include one or more instances of the given component. Similarly, throughout this detailed description, one or more instances of a given component may be included even if only one is shown, and/or embodiments that include only one instance may be used even if multiple instances are shown.

Figure 2:
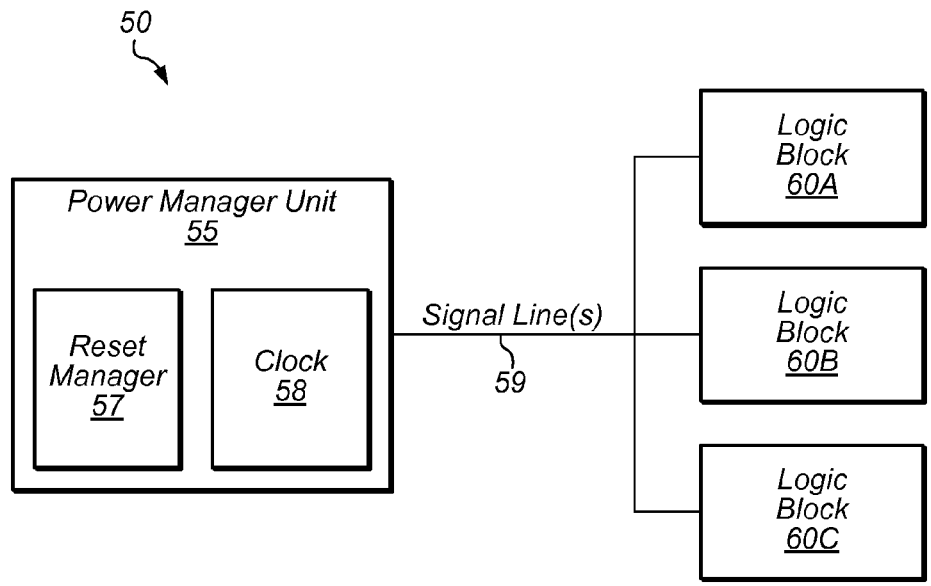
FIG. 2 is a block diagram of one embodiment of a system that allows logic blocks to be reset.

Turning now to FIG. 2, a block diagram 50 is shown of one embodiment of a system that allows logic blocks to be reset. As shown, FIG. 2 includes a power manager unit 55 coupled to logic blocks 60A-60C via one or more signal lines 59. In the embodiment of FIG. 2, power manager unit 55 includes reset manager 57 and clock 58.

As shown in the embodiment of FIG. 2, reset manager 57 and clock 58 are configured to use signal lines 59 to provide information to and/or receive information from logic blocks 60A-60C. Accordingly, signal lines 59 may comprise a clock bus, data bus, one or more point-to-point transmission lines, and/or any other data and/or signal transfer mechanism(s) as would occur to one with skill in the art.

Reset manager 57 is configured, in the embodiment of FIG. 2, to cause reset information to be transmitted to one or more of logic blocks 60. In the embodiment shown, clock 58 is configured to provide a clock signal to one or more of logic blocks 60. In various embodiments, clock 58 is configured to provide a high speed clock signal to logic blocks 60, which may themselves include portions that are configured to operate at a lower, divided clock signal, as discussed below. For example, clock 58 may provide a 2 GHz signal, which is divided down to some lesser frequency such as 500 MHz (although clock 58 is not limited to this example).

Figure 3:
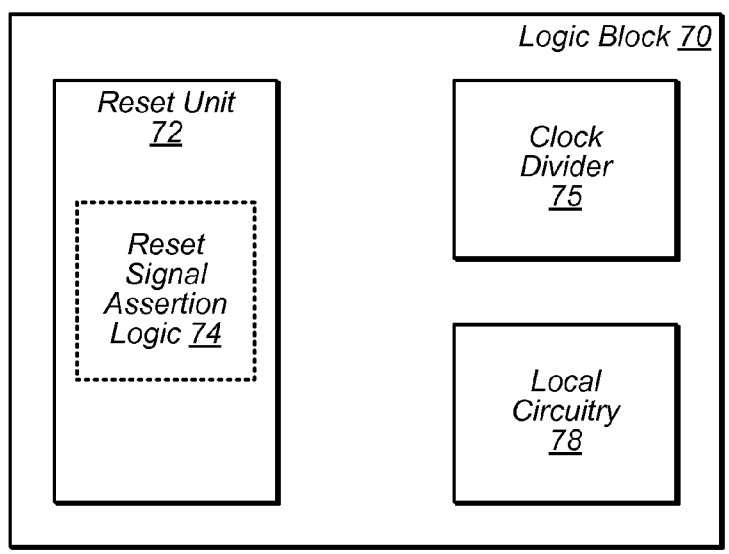
FIG. 3 is a block diagram of one embodiment of a logic block that may be reset.

Turning now to FIG. 3, a block diagram of one embodiment of a logic block 70 is shown. Logic block 70 may correspond to any one of logic blocks 60A-60C in various embodiments. As shown, logic block 70 comprises a reset unit 72, clock divider 75, and local circuitry 78. In some embodiments, reset unit 72 is coupled to clock divider 75 and/or local circuitry 78. Clock divider 75 may also be coupled to local circuitry 78 in some embodiments.

As depicted, reset unit 72 is configured to receive reset information. For example, reset information may be transmitted by power manager unit 55 to reset unit 72 in one embodiment. In various embodiments, the reset information that is received by reset unit 72 indicates that logic block 70 is to be reset.

As shown in FIG. 3, clock divider 75 is configured to receive a clock signal (e.g., from clock 58) and divide it down. A divided clock signal is then provided by clock divider 75 to a portion of logic block 70, such as local circuitry 78, that is configured to operate at the divided clock frequency in the embodiment of FIG. 3. In one embodiment, local circuitry 78 is therefore configured to operate at a lower clock frequency than output by clock 58. (Accordingly, local circuitry 78 may contain one or more flip-flops configured to operate using a local divided clock signal in various embodiments).

During a reset of logic block 70 in the embodiment of FIG. 3, clock divider 75 and local circuitry 78 will be reset back to a "default" starting condition. That is, various internal information stored in flip-flop logic within clock divider 75 and local circuitry 78 may be cleared. During reset in at least one embodiment, however, clock divider 75 may be incapable of dividing down a clock signal that is received from clock 58. Accordingly, during at least a portion of reset, clock divider 75 may not produce a divided clock signal that is usable by local circuitry 78, at least in some embodiments. Local circuitry 78 may therefore receive a higher frequency undivided clock signal (provided by clock 58), in some embodiments, during reset. This can potentially lead to incorrect circuit operation. Note that a reset period for local block 70 may last any number of cycles of clock 58 in various embodiments.

Reset unit 72 is thus configured, in the embodiment of FIG. 3, to receive reset information from power manager unit 55 and/or reset manager 57, and in response, cause clock divider 75 to complete reset prior before local circuitry 78 completes reset. After clock divider 75 first completes reset, it may then resume output of a divided clock signal, and in the embodiment of FIG. 3, local circuitry 78 completes reset at a later time and then receive the appropriate divided clock signal from clock divider 75. If local circuitry 78 completed reset prior to clock divider 75, on the other hand, in some embodiments this would cause local circuitry 78 to receive a high speed signal from clock 58, or no clock signal at all, which could cause incorrect operation.

Reset unit 72 is also configured to cause first and second reset signals to be respectively asserted to clock divider 75 and local circuitry 78 in one embodiment. In this embodiment, reset unit 72 may cause the first reset signal to be deasserted prior to causing the second reset signal to be deasserted, which may result in clock divider 75 emerging from reset—and thus generating a divided clock signal—before local circuitry 78 emerges from reset. Accordingly, in some embodiments, a portion of a circuit may stay "in reset" until a corresponding reset signal asserted to that circuit portion (e.g., by power manager unit 55 and/or reset unit 72) has been removed or deasserted. In such embodiments, circuitry that is being held in reset mode may not function to process ordinary input data. Once reset is completed, however, normal processing in local circuitry 78 (or other circuit portions) may resume. In one embodiment, reset signal assertion logic 74 is configured to assert and deassert particular reset signals (e.g., to clock divider 75 and local circuitry 78). Similar signal assertion logic may be found in power manager unit 55, in some embodiments, as is consistent with the techniques of this disclosure.

In one embodiment, reset unit 72 is configured to cause clock divider 75 and local circuitry 78 to begin reset in a same clock cycle (e.g., of clock 58). In other embodiments, clock divider 75 and local circuitry 78 may begin reset on different cycles of clock 58. The timing of reset for circuit portions such as clock divider 75 and local circuitry 78 may depend on various factors, such as when respective reset signals are received, or on a predefined or programmable delay (e.g., indicating that reset for a given circuit portion should last a certain number of clock cycles).

In one embodiment, reset unit 72 comprises one or more asynchronous reset flip-flops. As used herein, the term "asynchronous reset flip-flop" includes a flip-flop that is configured to be reset based on one or more input signals that do not include a clock signal. In other words, an asynchronous reset flip-flop does not require a transition of a clock (e.g., clock 58) in order to be reset. Thus, reset unit 72 may be configured to respond asynchronously to one or more particular signals from reset manager 57.

In some embodiments, reset unit 72 in logic block 70 is said to be in a different clock domain than local circuitry 78. In these embodiments, reset unit 72 is not configured to operate on a clock frequency on which local circuitry 78 is configured to operate. For example, all or a portion of reset unit 72 is configured, in some embodiments, to operate asynchronously without respect to clock 58 (or any clock). In another embodiment, reset unit 72 may be configured to operate on the clock domain of clock 58, while local circuitry 78 is configured to operate on a clock domain corresponding to clock 75.

Power manager unit 55 may be configured to determine if one or more particular circuit portions (e.g., logic block 70 and/or clock divider 75 and/or local circuitry 78) has completed reset (or a particular part of reset). Accordingly, in one embodiment, power manager unit 55 is configured to receive respective feedback from each of one or more logic blocks 70 that indicates that a logic block has completed reset. In other embodiments, however, power manager unit 55 may be configured to determine that reset for a given logic block has been completed because a given number of clock cycles and/or length of time has passed. For example, power manager unit 55 may be configured to assume that reset for a logic block has been completed after a number of predetermined clock cycles of clock 58 have elapsed since reset information was transmitted to that logic block.

In accordance with the above and other portions of this disclosure, one particular embodiment is a system that includes a plurality of logic blocks such as block 70, a clock (such as clock 58), and a power manager unit (such as unit 55). In such a system, each block may include a respective clock divider (e.g., clock divider 75) that is configured to divide a clock signal to produce a local clock signal. Each logic block may also include a respective reset unit (e.g., such as reset unit 72) that is configured, in response to a reset signal, to enable the respective clock divider for that logic block while local circuitry for that logic block is being reset. In one embodiment, enabling a respective clock divider for a given logic block comprises deasserting a reset input signal to that respective clock divider (which may cause that clock divider to exit reset and begin generating a divided clock signal). In one embodiment, power manager unit 55 is coupled to the plurality of logic blocks, and is configured to transmit a reset signal to the plurality of logic blocks in order to cause the logic blocks to be reset. Power manager unit 55 may also be configured, in one embodiment, to transmit a reset signal by deasserting one or more signal lines coupled to one or more logic blocks 70.

Figure 4:
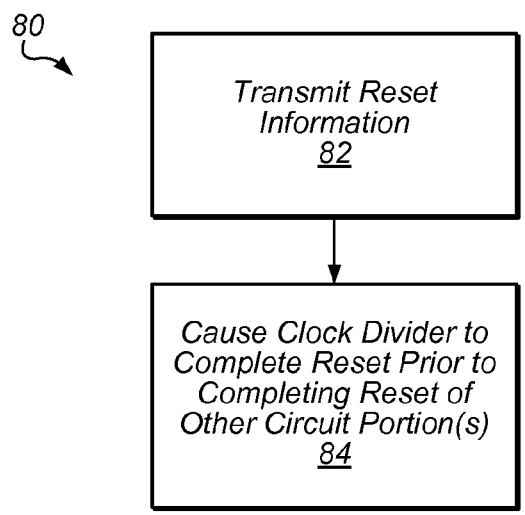
FIG. 4 is a flow chart of one embodiment of a method relating to transmission of reset information to a logic block.

Turning now to FIG. 4, a flow chart 80 of one embodiment of a method involving the transmission of reset information is shown. In various embodiments, step 82 includes transmitting reset information from a management unit (e.g., power manager unit 55) to a logic block (e.g., logic block 70). As depicted in FIG. 4, reset information is transmitted to a logic block that includes a clock divider (e.g., clock divider 75) configured to provide a divided clock frequency to a first portion of the logic block (e.g., local circuitry 78). In the embodiment of FIG. 4, clock divider 75 is configured, in response to received reset information, to complete reset prior to a first portion of the logic block completing reset. Thus, in the embodiment of FIG. 4, clock divider 75 completes reset prior to local circuitry 78, resulting in a divided clock signal being provided to local circuitry 78 before it exits reset.

In a further embodiment of FIG. 4, power manager unit 55 provides reset information to a plurality of logic blocks (e.g., blocks 60 and/or 70). In yet another embodiment of FIG. 4, first and second reset signals are respectively asserted to clock divider 75 and local circuitry 78, and the first reset signal is deasserted prior to the second reset signal being deasserted (which may cause the clock divider 75 to exit reset prior to local circuitry 78 exiting from reset). In another embodiment, a predetermined number of clock cycles elapses before a reset signal is deasserted.

Thus, in some embodiments, power manager unit 55 may wait a predetermined number of clock cycles (e.g., of clock 58) before deasserting a reset signal sent to a logic block. In one embodiment, reset unit 72 may wait for a first predetermined number of clock cycles before deasserting a first reset signal to clock divider 75, while waiting for a second, longer number of predetermined number of clock cycles before deasserting a second reset signal to local circuitry 78. For timing purposes, a number of clock cycles for measuring reset may be measured with reference to clock 58 in some embodiments, while in other embodiments, clock cycles may be counted in terms of clock divider 75 or another clock. In yet another embodiment, power manager unit 55 directly causes first and second reset signals to be respectively deasserted to clock divider 75 and local circuitry 78 (as opposed to all or a portion of this operation being performed by reset unit 72, as in some embodiments).

In another embodiment of FIG. 4, logic block 70 may send information to a management unit (which may comprise power manager unit 55) indicating that all portions of logic block 70 have completed reset (including but not limited to clock divider 75 and local circuitry 78). Also note that in some embodiments, reset of a logic block may include resetting one or more other circuits or portions of circuits. Thus in one embodiment, logic block 70 includes two or more clock dividers 75, which may be configured to provide different clock signals (which may be of different frequencies) to two or more local circuitries 78 (which may likewise be configured to respectively operate at the different frequencies provided by the different clock signals).

Figure 5:
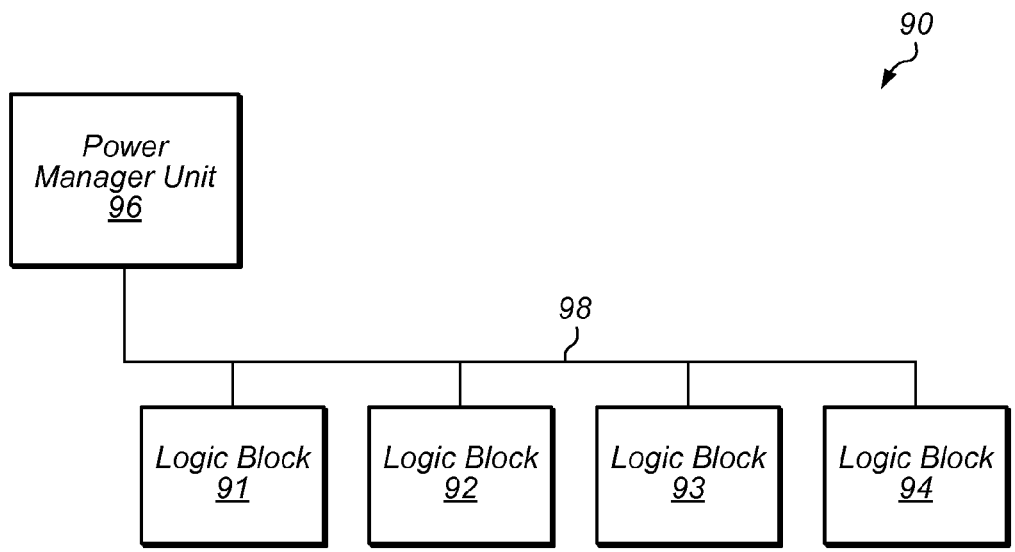
FIG. 5 is a block diagram of one embodiment of a power manager unit that is coupled to a plurality of logic blocks.

Turning now to FIG. 5, a block diagram 90 is shown of one embodiment of a power manager unit 96 coupled to a plurality of logic blocks 91-94. Power manager unit 96 may have any or all of the features, functionality, and characteristics of power manager unit 55 in various embodiments. Likewise, each of logic blocks 91, 92, 93, and 94 may have any or all of the features, functionality, and characteristics of logic blocks 60 and/or 70 in various embodiments. As depicted, power manager unit 96 is coupled to logic blocks 91, 92, 93, and 94 via one or more connection lines 98. Connection lines 98 may comprise one or more point-to-point transmission lines, a bus, and/or any other data and/or signal transfer mechanism(s) as would occur to one with skill in the art. In various embodiments, power manager unit 96 may be coupled via connection lines 98 to a greater or lesser number of logic blocks than shown.

One or more of logic blocks 91-94 may include a memory PHY device and/or a memory controller in various embodiments. Thus in one embodiment, one or more of logic blocks 91-94 includes a memory PHY device and a memory controller (not depicted). Each of logic blocks 91-94 may be coupled respectively to different physical portions of a memory device (e.g., RAM) in various embodiments. In one embodiment, logic blocks 91 and 92 are respectively coupled to first and second portions of a first memory, while logic blocks 93 and 94 are respectively coupled to first and second portions of a second memory. Many other configurations are possible, however, such as each logic block (which may comprise a PHY) being coupled to a different memory, or two or more logic blocks being coupled to a same memory. In some embodiments, multiple memory controllers may be present, and may control additional logic blocks and/or PHYs.

As shown in the embodiment of FIG. 5, logic blocks 91-94 may be physically distributed across a large area, which can cause transmission skew. For example, reset information may arrive at different logic blocks at different times—e.g., reset information transmitted from power manager unit 96 may be received first at logic block 91 and last at logic block 94. Because reset information may arrive at each one of logic blocks 91-94 at different times, it is possible that the logic blocks will emerge from reset without being in synchronization with each other, as described below, which may impede communication between logic blocks.

A single high speed clock signal may be sent to different portions of a chip in order to drive local divided clocks (that operate at lower rates). For example, imagine that for two given logic blocks (e.g., PHYs), a high speed clock signal is divided by two. If these different logic blocks have to communicate with each other, it may be necessary in some embodiments that the logic blocks agree on which phase of the high speed clock signal that their respective divided clock cycles start on.

For example, if a high speed clock is divided by two, two possibilities for when to begin a divided (lower speed) clock cycle are (A) on the rising edge of the high speed clock's first cycle (e.g., cycle #0) and (B) on the rising edge of the high speed clock's second cycle (e.g., cycle #1). Accordingly, in some embodiments, if logic block 91 begins operating its divided clock 75 on high speed cycle #0 while logic block 94 begins operating its own respective divided clock on a different (subsequent) high speed clock cycle, logic blocks 91 and 94 may be out of phase and unable to communicate with one another.

Accordingly, in some embodiments, a state machine may stop a high speed clock (e.g., clock 58), and then cause an asynchronous reset signal to be sent to one or more logic blocks and/or clock dividers. This asynchronous reset signal may then be removed in one embodiment, but until the high speed clock has resumed, the logic blocks (or portions thereof) do not begin to operate. When the high speed clock is restarted, however, local clock dividers in the one or more logic blocks will begin dividing on the same phase in the embodiment of FIG. 5. Logic for stopping and restarting clock 58 may be included in power manager unit 96 and/or reset manager 57 in various embodiments.

Figure 6:
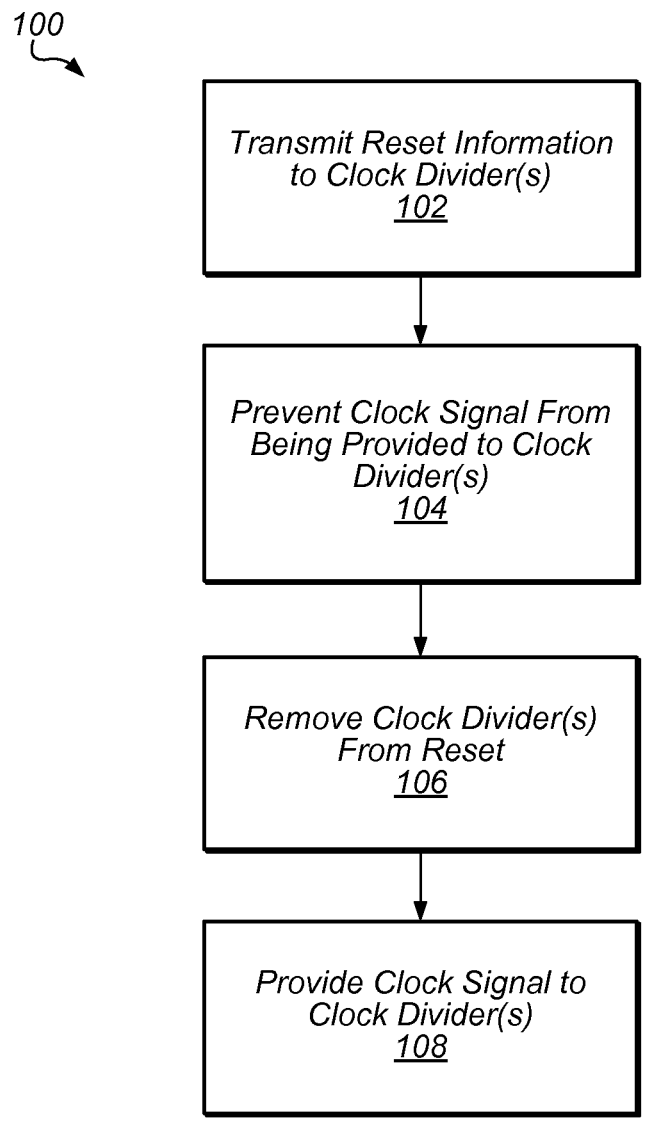
FIG. 6 is a flowchart of one embodiment of a method relating to circuit reset.

Turning now to FIG. 6, a flowchart 100 of one embodiment of a method relating to circuit reset is shown. In step 102, reset information is transmitted to one or more clock dividers 75 for one or more logic blocks (e.g., such as blocks 91-94). This transmitted reset information indicates, in one embodiment, that each of a group of one or more clock dividers is to be reset. This reset information may also indicate, in some embodiments, that an entire logic block, including a clock divider, is to be reset. Upon receipt of transmitted reset information at a clock divider 75, the clock divider may thus begin reset, in various embodiments. In one embodiment, the reset information transmitted to one or more clock dividers 75 is a reset signal asserted over connection lines 98.

In step 104, a first clock signal is prevented from reaching one or more clock dividers 75 for one or more logic blocks. In some embodiments, all or a portion of step 104 is performed by reset manager 57, which may cause a first clock signal from clock 58 to stop arriving at one or more logic blocks 91-94 (e.g., by using clock gating to halt a clock signal at the clock source). Note that in some embodiments, all or a part of step 104 may be performed before all or a part of step 102 (i.e., steps 102 and 104 may be performed in any order).

In step 106, one or more clock dividers 75 for one or more logic blocks 91-94 are removed from reset. In one embodiment, all or a portion of step 106 is performed by reset manager 57 (for example, deasserting a reset signal to a logic block and/or clock divider). In other embodiments, all or a portion of step 106 is performed by reset unit 72 (for example, deasserting a reset signal to clock divider 75). However, in one or more embodiments, local divided clocks may not resume providing a divided clock signal until a high speed clock is resumed.

Accordingly, in step 108, a first clock signal is again provided to respective clock dividers 75 for one or more logic blocks (e.g., by clock 58). All or a portion of step 108 may be performed, in various embodiments, by reset manager 57, power manager 55, clock 58, and/or reset unit 72 in various embodiments. In one embodiment, causing a first clock signal to again be provided to one or more clock dividers 75 causes each clock divider to begin providing respective divided clock signals on a same cycle of clock 58, but at a frequency that is lower than a frequency of clock 58.

Preset and/or variable timings may be used, in some embodiments, to appropriately time the execution of steps 102-108 (as well as other actions or steps as described herein, e.g., with respect to FIG. 4). Accordingly, in some embodiments, respective predetermined numbers of clock cycles (e.g., of clock 58) may elapse between steps 102 and 104, steps 104 and 106, and steps 106 and 108. One or more registers (not depicted) in power manager unit 55, for example, may be used to hold respective timing delay values that are used to determine when to begin a subsequent step. For example, it may be the case that after 5, 10, 100, 200, or some other number of clock cycles, reset for a plurality of clock dividers is assumed to be complete, and a next step can begin (e.g., resuming a high speed clock signal from clock 58).

Exemplary Computer System

Figure 7:
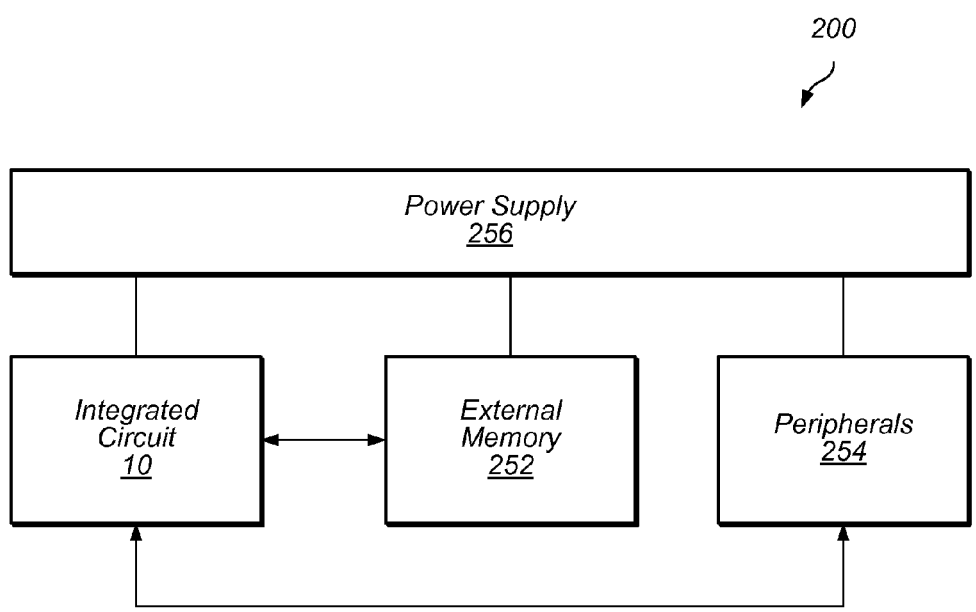
FIG. 7 is a block diagram of one embodiment of a computer system in which structures and techniques relating to circuit reset may be applied.

Turning next to FIG. 7 a block diagram is shown of one embodiment of a system 200 in which the structures and techniques of this disclosure may be applied. In the illustrated embodiment, the system 200 includes at least one instance of an integrated circuit 10 coupled to an external memory 252. The external memory 252 may form the main memory subsystem discussed above with regard to FIG. 1 (e.g. the external memory 252 may include the memory 12A-12B). The integrated circuit 10 is coupled to one or more peripherals 254 and the external memory 252. A power supply 256 is also provided which supplies the supply voltages to the integrated circuit 10 as well as one or more supply voltages to the memory 252 and/or the peripherals 254. In some embodiments, more than one instance of the integrated circuit 10 may be included (and more than one external memory 252 may be included as well).

The memory 252 may be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with an integrated circuit 10 in a chip-on-chip configuration, a package-on-package configuration, or a multi-chip module configuration.

The peripherals 254 may include any desired circuitry, depending on the type of system 200. For example, in one embodiment, the system 200 may be a mobile device (e.g. personal digital assistant (PDA), smart phone, etc.) and the peripherals 254 may include devices for various types of wireless communication, such as wifi, Bluetooth, cellular, global positioning system, etc. The peripherals 254 may also include additional storage, including RAM storage, solid state storage, or disk storage. The peripherals 254 may include user interface devices such as a display screen, including touch display screens or multitouch display screens, keyboard or other input devices, microphones, speakers, etc. In other embodiments, the system 200 may be any type of computing system (e.g. desktop personal computer, laptop, workstation, net top etc.).

Computer Readable Medium and Hardware Fabrication

The above-described techniques and methods may be implemented as computer-readable instructions stored on any suitable computer-readable storage medium. As used herein, the term computer-readable storage medium refers to a (non-transitory, tangible) medium that is readable by a computer or computer system, and includes magnetic, optical, and solid-state storage media such as hard drives, optical disks, DVDs, volatile or nonvolatile RAM devices, holographic storage, programmable memory, etc. The term "non-transitory" as applied to computer readable media herein is only intended to exclude from claim scope any subject matter that is deemed to be ineligible under 35 U.S.C. §101, such as transitory (intangible) media (e.g., carrier waves), and is not intended to exclude any subject matter otherwise considered to be statutory.

Such a computer-readable storage medium as described above can be used in some embodiments to store instructions read by a program and used, directly or indirectly, to fabricate the hardware comprising any or all portions of the structures of FIG. 2, FIG. 3, FIG. 5, IC 10, and/or portions thereof. For example, the instructions may outline one or more data structures describing a behavioral-level or register-transfer level (RTL) description of the hardware functionality in a high level design language (HDL) such as Verilog or VHDL. The description may be read by a synthesis tool, which may synthesize the description to produce a netlist. The netlist may comprise a set of gates (e.g., defined in a synthesis library), which represent the functionality of the structures of FIG. 2, FIG. 3, FIG. 5, IC 10, and/or portions thereof. The netlist may then be placed and routed to produce a data set describing geometric shapes to be applied to masks. The masks may then be used in various semiconductor fabrication steps to produce a semiconductor circuit or circuits corresponding to hardware embodiments. Alternatively, the database may be the netlist (with or without the synthesis library) or the data set, as desired. One embodiment is thus a (non-transitory) computer readable storage medium comprising a data structure which is usable by a program executable on a computer system to perform a portion of a process to fabricate an integrated circuit including circuitry described by the data structure, wherein the circuitry described in the data structure includes the structures of FIG. 2, FIG. 3, FIG. 5, IC 10, and/or portions thereof.

LISTING OF SELECTED EMBODIMENTS

The following embodiment listings are provided in accordance with the structures and techniques of this disclosure.

Embodiment 1

A circuit, comprising:

a reset unit configured to receive reset information indicating a logic block is to be reset, wherein the reset unit is coupled to a clock divider, and wherein at least a portion of the logic block is configured to operate at a divided clock frequency provided by the clock divider;

wherein the reset unit is configured, in response to receiving the reset information, to cause the clock divider to complete reset prior to causing the portion of the logic block to complete reset.

Embodiment 2

The circuit of embodiment 1, wherein the reset unit is configured to cause a first reset signal to be asserted to the clock divider and a second reset signal to be asserted to the at least a portion of the logic block;

wherein the reset unit is configured, in response to the reset information, to cause the first reset signal to be deasserted prior to causing the second reset signal to be deasserted.

Embodiment 3

The circuit of embodiment 1, wherein the reset unit is configured, in response to the reset information, to cause reset of the clock divider and of the at least a portion of the logic block to begin in a same clock cycle.

Embodiment 4

The circuit of embodiment 1, further comprising the logic block;

wherein the logic block comprises the reset unit and clock divider, and wherein the clock divider is configured to receive a clock signal that is generated by a clock external to the logic block.

Embodiment 5

The circuit of embodiment 1, wherein the reset unit comprises one or more asynchronous reset flip-flops.

Embodiment 6

The circuit of embodiment 3, wherein the reset unit is configured to determine a number of clock cycles to wait between said causing the first reset signal to be deasserted and said causing the second reset signal to be deasserted.

Embodiment 7

The circuit of embodiment 1, further comprising a power manager unit configured to transmit the reset information to a plurality of logic blocks that include the logic block.

Embodiment 8

The circuit of embodiment 7, wherein the power manager unit includes a clock configured to provide a first clock signal at a first clock frequency to the plurality of logic blocks, and wherein the plurality of logic blocks include a respective plurality of clock dividers that are configured to provide second clock signals at clock frequencies lower than the first clock frequency.

Embodiment 9

A system, comprising:
a clock configured to generate a clock signal;
a plurality of logic blocks, wherein each of the plurality of logic blocks includes a respective clock divider configured to divide the clock signal to produce a local clock signal, wherein each of the plurality of logic blocks includes a respective reset unit that is configured, in response to reset information, to enable the respective clock divider for that logic block while local circuitry for that logic block is being reset; and
a power manager unit coupled to the plurality of logic blocks, wherein the power manager unit is configured to transmit the reset information to the plurality of logic blocks to cause the plurality of logic blocks to be reset.

Embodiment 10

The system of embodiment 9, wherein the local circuitry for each of the plurality of logic blocks includes one or more flip flops that are configured to operate using the respective local clock signal for that logic block.

Embodiment 11

The system of embodiment 9, wherein the power manager unit includes the clock and is configured to transmit the reset information by deasserting one or more signals transmitted over one or more signal lines coupled to the plurality of the logic blocks.

Embodiment 12

The system of embodiment 9, wherein the respective reset unit of each of the plurality of blocks is in a different clock domain than the local circuitry for that logic block.

Embodiment 13

The system of embodiment 9, wherein the power manager unit is configured to receive respective feedback from each of the plurality of logic blocks indicating that block has completed reset.

Embodiment 14

A method, comprising:
transmitting reset information to a plurality of logic blocks, each of which respectively includes a clock divider configured to receive a first clock signal and provide a divided clock signal in response;
preventing the first clock signal from reaching the respective clock divider for each of the plurality of logic blocks;
subsequent to said preventing, causing the respective clock divider for each of the plurality of logic blocks to be removed from reset; and
subsequent to said causing the respective clock divider for each of the plurality of logic blocks to be removed from reset, causing the first clock signal to again be provided to the respective clock divider for each of the plurality of logic blocks.

Embodiment 15

The method of embodiment 14, further comprising waiting a predetermined number of clock cycles before causing the first clock signal to again be provided to the respective clock divider for each of the plurality of logic blocks.

Embodiment 16

The method of embodiment 14, wherein said transmitting the reset information is performed by a power manager unit that comprises a clock configured to provide the first clock signal to the plurality of logic blocks.

Embodiment 17

The method of embodiment 15, wherein preventing the first clock signal from being provided to the respective clock divider for each of the plurality of logic blocks comprises the power manager unit halting a transmission of the first clock signal.

Embodiment 18

The method of embodiment 14, wherein transmitting the reset information comprises asserting a reset signal over a shared line coupled to two or more of the plurality of logic blocks.

Embodiment 19

The method of embodiment 18, wherein causing the respective clock divider for each of the plurality of logic blocks to be removed from reset comprises deasserting the reset signal over the shared line.

Embodiment 20

The method of embodiment 16, wherein causing the first clock signal to again be provided causes the respective clock divider for each of the plurality of logic blocks to begin providing respective divided clock signals on a same cycle of the clock, at a same frequency lower than a frequency of the clock.

Embodiment 21

A system, comprising:
a plurality of logic blocks, each including respective local circuitry configured to operate using a divided clock signal generated from a clock signal; and
a clock configured to provide the clock signal to the plurality of logic blocks;
wherein the apparatus is configured to reset the plurality of logic blocks by:
  transmitting reset information to the plurality of blocks;
  preventing the clock signal from being provided to the respective local circuitry included in each of the plurality of logic blocks;
  subsequent to said preventing, causing the respective local circuitry included in each of the plurality of logic blocks to be removed from reset; and
  subsequent to said causing the respective local circuitry to be removed from reset, causing the clock signal to again be provided to the respective local circuitry included in each of the plurality of logic blocks.

Embodiment 22

The system of embodiment 21, wherein transmitting the reset information comprises asserting a reset signal to the plurality of logic blocks;

Embodiment 23

The system of embodiment 22, wherein causing the respective local circuitry in each of the plurality of logic blocks comprises deasserting the reset signal.

Embodiment 24

The system of embodiment 21, wherein preventing the clock signal from being provided includes halting a transmission of the clock signal from the clock.

Embodiment 25

The system of embodiment 21, wherein the transmitted reset signal arrives asynchronously at each of the plurality of logic blocks with respect to a clock domain of the clock.

Embodiment 26

A method, comprising:
transmitting reset information from a management unit to a logic block, wherein the logic block includes a first portion and a clock divider configured to provide a divided clock frequency, and wherein the first portion of the logic block is configured to operate at the divided clock frequency; and
in response to the received reset information, causing the clock divider to complete reset prior to causing the first portion of the logic block to complete reset.

Embodiment 27

The method of embodiment 11, wherein the management unit comprises a power manager unit that is configured to provide the reset information to a plurality of logic blocks.

Embodiment 28

The method of embodiment 11, further comprising:
causing first and second reset signals to be respectively asserted to the clock divider and first portion of the logic block; and
causing the first reset signal to be deasserted prior to causing the second reset signal to be deasserted.

Embodiment 29

The method of embodiment 13, further comprising waiting a predetermined number of clock signals for the clock divider to finish reset before deasserting the first reset signal.

Embodiment 30

The method of embodiment 11, further comprising sending, from the logic block to the management unit, information indicating that reset of all portions of the logic block is complete.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure. Additionally, section or heading titles provided above in the detailed description should not be construed as limiting the disclosure in any way.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:
1. A circuit, comprising:
  a reset unit configured to receive reset information indicating a logic block is to be reset, wherein the reset unit is coupled to a clock divider, and wherein at least a portion of the logic block is configured to operate at a divided clock frequency provided by the clock divider;
  wherein the reset unit is configured, in response to receiving the reset information, to cause the clock divider to complete reset prior to causing the portion of the logic block to complete reset.

2. The circuit of claim 1, wherein the reset unit is configured to cause a first reset signal to be asserted to the clock divider and a second reset signal to be asserted to the at least a portion of the logic block;

wherein the reset unit is configured, in response to the reset information, to cause the first reset signal to be deasserted prior to causing the second reset signal to be deasserted.

3. The circuit of claim 2, wherein the reset unit is configured to determine a number of clock cycles to wait between said causing the first reset signal to be deasserted and said causing the second reset signal to be deasserted.

4. The circuit of claim 1, wherein the reset unit is configured, in response to the reset information, to cause reset of the clock divider and of the at least a portion of the logic block to begin in a same clock cycle.

5. The circuit of claim 1, further comprising the logic block;

wherein the logic block comprises the reset unit and clock divider, and wherein the clock divider is configured to receive a clock signal that is generated by a clock external to the logic block.

6. The circuit of claim 1, wherein the reset unit comprises one or more asynchronous reset flip-flops.

7. The circuit of claim 1, further comprising a power manager unit configured to transmit the reset information to a plurality of logic blocks that include the logic block.

8. The circuit of claim 7, wherein the power manager unit includes a clock configured to provide a first clock signal at a first clock frequency to the plurality of logic blocks, and wherein the plurality of logic blocks include a respective plurality of clock dividers that are configured to provide second clock signals at clock frequencies lower than the first clock frequency.

9. A system, comprising:

a clock configured to generate a clock signal;

a plurality of logic blocks, wherein each of the plurality of logic blocks includes a respective clock divider configured to divide the clock signal to produce a local clock signal, wherein each of the plurality of logic blocks includes a respective reset unit that is configured, in response to reset information, to enable the respective clock divider for that logic block while local circuitry for that logic block is being reset; and a power manager unit coupled to the plurality of logic blocks, wherein the power manager unit is configured to transmit the reset information to the plurality of logic blocks to cause the plurality of logic blocks to be reset.

10. The system of claim 9, wherein the local circuitry for each of the plurality of logic blocks includes one or more flip flops that are configured to operate using the respective local clock signal for that logic block.

11. The system of claim 9, wherein the power manager unit includes the clock and is configured to transmit the reset information by deasserting one or more signals transmitted over one or more signal lines coupled to the plurality of the logic blocks.

12. The system of claim 9, wherein the respective reset unit of each of the plurality of blocks is in a different clock domain than the local circuitry for that logic block.

13. The system of claim 9, wherein the power manager unit is configured to receive respective feedback from each of the plurality of logic blocks indicating that block has completed reset.

14. A method, comprising:

transmitting reset information to a plurality of logic blocks, each of which respectively includes a clock divider configured to receive a first clock signal and provide a divided clock signal in response;

preventing the first clock signal from reaching the respective clock divider for each of the plurality of logic blocks;

subsequent to said preventing, causing the respective clock divider for each of the plurality of logic blocks to be removed from reset; and subsequent to said causing the respective clock divider for each of the plurality of logic blocks to be removed from reset, causing the first clock signal to again be provided to the respective clock divider for each of the plurality of logic blocks.

15. The method of claim 14, further comprising waiting a predetermined number of clock cycles before causing the first clock signal to again be provided to the respective clock divider for each of the plurality of logic blocks.

16. The method of claim 14, wherein said transmitting the reset information is performed by a power manager unit that comprises a clock configured to provide the first clock signal to the plurality of logic blocks.

17. The method of claim 16, wherein preventing the first clock signal from being provided to the respective clock divider for each of the plurality of logic blocks comprises the power manager unit halting a transmission of the first clock signal.

18. The method of claim 16, wherein causing the first clock signal to again be provided causes the respective clock divider for each of the plurality of logic blocks to begin providing respective divided clock signals on a same cycle of the clock, at a same frequency lower than a frequency of the clock.

19. The method of claim 14, wherein transmitting the reset information comprises asserting a reset signal over a shared line coupled to two or more of the plurality of logic blocks.

20. The method of claim 19, wherein causing the respective clock divider for each of the plurality of logic blocks to be removed from reset comprises deasserting the reset signal over the shared line.

* * * * *